(12) United States Patent
Choi et al.

(10) Patent No.: US 8,198,789 B2
(45) Date of Patent: Jun. 12, 2012

(54) APPARATUS FOR GENERATING ELECTRICAL ENERGY AND METHOD FOR MANUFACTURING THE SAME

(75) Inventors: Duk-Hyun Choi, Hwaseong-si (KR); Jae-Young Choi, Suwon-si (KR); Sang-Yoon Lee, Seoul (KR); Sang-Woo Kim, Gumi-si (KR)

(73) Assignees: Samsung Electronics Co., Ltd. (KR); Kumoh National Institute of Technology Industry-Academic Cooperation (KR)

( * ) Notice: Subject to any disclaimer, the term of this patent is extended or adjusted under 35 U.S.C. 154(b) by 0 days.

(21) Appl. No.: 12/862,919

(22) Filed: Aug. 25, 2010

(65) Prior Publication Data
US 2011/0050042 A1   Mar. 3, 2011

(30) Foreign Application Priority Data

Aug. 25, 2009  (KR) .................. 10-2009-0078948
Oct. 5, 2009   (KR) .................. 10-2009-0094374
May 18, 2010   (KR) .................. 10-2010-0046629

(51) Int. Cl.
*H01L 41/08* (2006.01)
(52) U.S. Cl. .................. 310/339; 310/311
(58) Field of Classification Search ............. 310/311
See application file for complete search history.

(56) References Cited

U.S. PATENT DOCUMENTS

| | | | | |
|---|---|---|---|---|
| 2,816,236 A | * | 12/1957 | Rosen | 250/214 LA |
| 3,543,083 A | * | 11/1970 | Sylvander | 315/55 |
| 3,560,955 A | * | 2/1971 | Hallman | 345/84 |
| 3,647,665 A | * | 3/1972 | Lester | 204/194 |
| 4,524,294 A | * | 6/1985 | Brody | 310/311 |
| 5,446,334 A | * | 8/1995 | Gaffney | 310/338 |
| 7,705,523 B2 | * | 4/2010 | Wang et al. | 310/339 |
| 2004/0060591 A1 | | 4/2004 | Den | |
| 2011/0204317 A1 | * | 8/2011 | Park et al. | 257/9 |

FOREIGN PATENT DOCUMENTS

| | | |
|---|---|---|
| JP | 2006199552 | 8/2006 |
| JP | 2007142386 | 6/2007 |
| KR | 1020080102888 | 11/2008 |
| KR | 1020090033713 | 4/2009 |

* cited by examiner

*Primary Examiner* — Mark Budd
(74) *Attorney, Agent, or Firm* — Cantor Colburn LLP

(57) ABSTRACT

Disclosed is an apparatus for generating electrical energy that includes; a first electrode, and a second electrode spaced apart from the first electrode, and an energy generation layer disposed between the first electrode and the second electrode, wherein the energy generation layer comprises a photoelectric conversion layer and a plurality of piezoelectric nanowires, and wherein when an external force is applied to at least one of the first electrode and the second electrode, the plurality of piezoelectric nanowires are transformed to generate electrical energy.

52 Claims, 17 Drawing Sheets

US 8,198,789 B2

APPARATUS FOR GENERATING ELECTRICAL ENERGY AND METHOD FOR MANUFACTURING THE SAME

CROSS-REFERENCE TO RELATED APPLICATIONS

This application claims priority to Korean Patent Application No. 10-2009-0078948, filed on Aug. 25, 2009, Korean Patent No. 10-2009-0094374, filed on Oct. 5, 2009, and Korean Patent No. 10-2010-0046629 filed on May 18, 2010, the contents of which in their entirety are herein incorporated by reference.

BACKGROUND

1. Field

This disclosure relates to an apparatus for generating electrical energy, and a method of manufacturing the apparatus for generating electrical energy.

2. Description of the Related Art

Recently, the advent of nanoscale devices has been enabled due to a decreasing in size, and an increase in performance, of electronic devices. In order to manufacture the nanoscale devices, technologies such as nanowire formation have been developed. The term "nanowire" as used herein refers to an ultrafine wire having a cross-sectional diameter from about a few nm to about a few hundred nm. The length of the nanowire may be grown to tens to thousands of times, or more, of the diameter thereof.

The nanowire may exhibit different electrical, chemical, physical, and optical characteristics from general characteristics of an existing bulk structure. Increasingly integrated and intricate devices can be realized using molecular characteristics of nanowire together with the characteristics of a bulk structure. The nanowire can be used in various products such as lasers, transistors, memories, sensors, and other similar devices.

Further, there is a recent trend of manufacturing mobile electronic devices which are downsized and portable, and integrating various different functions therein. In order to supply electric power to the mobile electronic devices, a battery having appropriate capacity is used. However, the capacity of a battery supplying electric power to the devices may falls behind the function-integrated speed of the devices; that is, the existing battery may be insufficient to rapidly supply the needed electrical power in an existing mobile electronic device. Therefore, there is a need for a backup battery, and the backup battery may be required to be developed as wireless chargeable emergency power source.

SUMMARY

An embodiment provides an apparatus for generating electrical energy by using applied stresses when light is not applied, and which generates electrical energy by absorption of light, such as sunlight, and a method for manufacturing the apparatus for generating electrical energy.

One embodiment of an apparatus for generating electrical energy includes; a first electrode, and a second electrode spaced apart from the first electrode, and an energy generation layer disposed between the first electrode and the second electrode, wherein the energy generation layer includes a photoelectric conversion layer and piezoelectric layer, and when external force is applied to at least one of the first electrode and the second electrode, the piezoelectric layer is transformed to generate electrical energy.

Another aspect of this disclosure provides a method of manufacturing the above described embodiment of an apparatus for generating electrical energy.

One embodiment of a method for manufacturing the above embodiment of an apparatus for generating electrical energy includes; disposing a first electrode on a substrate, disposing a plurality of nanowires made of a piezoelectric material on the first electrode, forming a photoelectric conversion layer electrically connected to the nanowire on the first electrode, and disposing a second electrode on the nanowire and the photoelectric conversion layer, wherein when an external force is applied to at least one of the first electrode and the second electrode, the plurality of nanowires may be transformed to generate electrical energy. In one embodiment the piezoelectric layer may include a single piezoelectric nanowire.

In the embodiment where light, such as sunlight, is irradiated, a photoactive layer absorbs the light to generate electrical energy, and efficient transport of the electrical energy generated using light may be induced due to a piezoelectric layer adjacent to the photoactive layer.

In the embodiment wherein light is not irradiated to the apparatus for generating electrical energy, electrical energy may be generated by applying stress to a piezoelectric material layer, thereby transforming the piezoelectric layer.

The energy generation by sunlight and the energy generation by the piezoelectric effect may occur simultaneously, and in such an embodiment, the apparatus may have improved energy generation efficiency and a multifunctional device that simultaneously realizes energy generation and pressure sensing can be developed.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
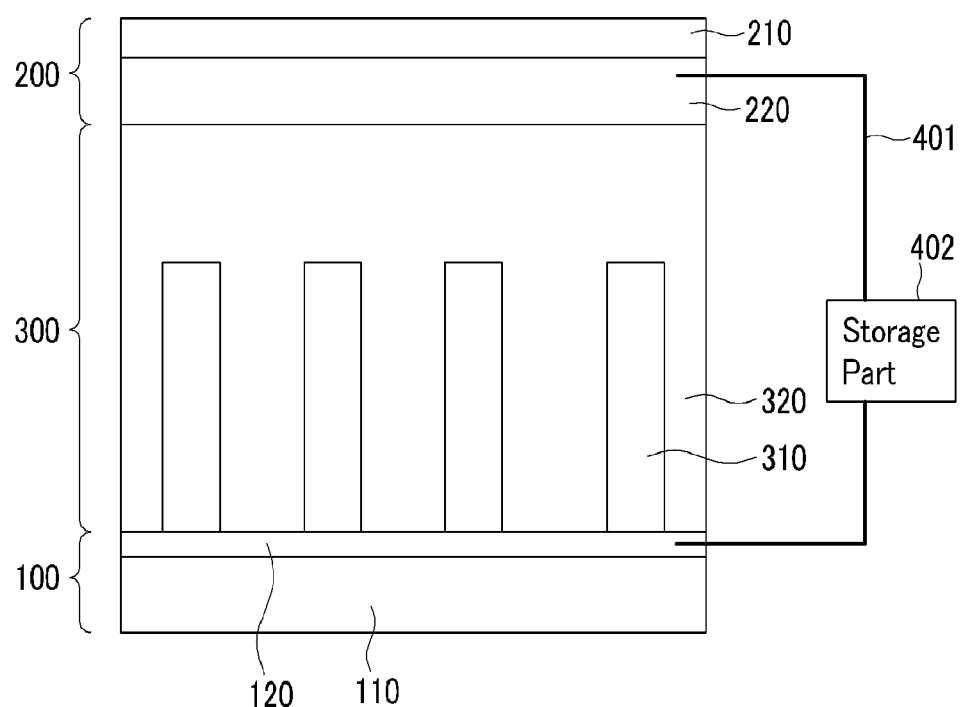
FIG. 1 is a schematic cross-sectional view of an embodiment of an apparatus for generating electrical energy.

Embodiments now will be described more fully hereinafter with reference to the accompanying drawings, in which embodiments are shown. These embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, the embodiments will be described in detail with reference to the accompanying drawings.

Figure 2:
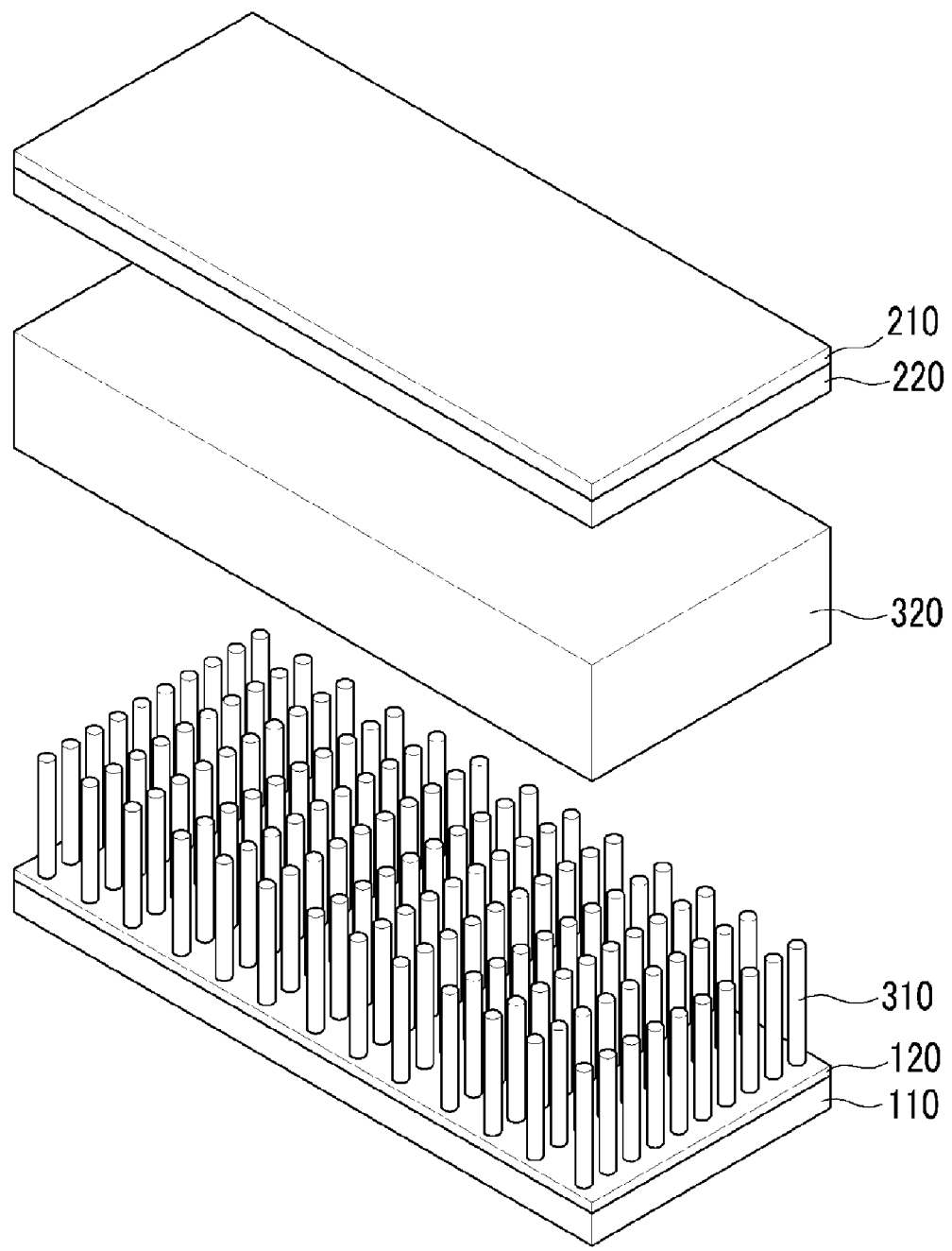
FIG. 2 is an exploded perspective view of the embodiment of an apparatus for generating electrical energy shown in FIG. 1.

Referring to FIGS. 1 and 2, an embodiment of an apparatus for generating electrical energy is described in detail. FIG. 1 is a schematic cross-sectional view of an embodiment of an apparatus for generating electrical energy, and FIG. 2 is an exploded perspective view of the embodiment of an apparatus for generating electrical energy shown in FIG. 1.

Referring to FIG. 1 and FIG. 2, an apparatus for generating electrical energy includes a lower substrate 100 and an upper substrate 200 disposed substantially opposite to each other, an energy generation layer 300 that is disposed between the lower substrate 100 and the upper substrate 200, a connection part 401 that electrically connects the lower substrate 100 and the upper substrate 200, and a storage part 402 that is connected to the connection part 401. In one embodiment, the energy generation layer 300 may be formed on the lower substrate 100.

The lower substrate 100 includes a first substrate 110 and a first electrode 120 formed on the first substrate 110, and the upper substrate 200 includes a second substrate 210 and a second electrode 220 formed on the second substrate. In one embodiment, the first substrate 110 and the second substrate 210 may be flexible and transparent. Although not shown in drawings, in order to facilitate transport of electrons and holes, a blocking layer or a transport layer may be formed on the first electrode 120 or the second electrode 220. The blocking layer functions to ensure that charge carriers of only one type flow in one direction. For example, by coating a molybdenum oxide (MoOx) layer on the second electrode 220, electron transport may be blocked and hole transport may be improved, thereby selectively transporting holes to the second electrode 220.

Embodiments include configurations wherein the first substrate 110 and the second substrate 210 may include a flexible material such as plastic so that it may be configured to be transformed external stresses applied thereto. In one embodiment the first electrode 120 may include indium tin oxide ("ITO"), carbon nanotubes ("CNT"), a graphene material, a transparent conductive polymer, other materials with similar characteristics, or combinations thereof. The second electrode 220 may include gold (Au), an Au-palladium alloy (AuPd), palladium (Pd), platinum (Pt), ruthenium (Ru), and other materials with similar characteristics, or combinations thereof. At least one of the first electrode 120 and the second electrode 220 may be a flexible electrode configured to be transformed by stresses applied thereto.

The first electrode 120 and the second electrode 220 may be connected to each other by the connection part 401. Embodiments include configurations wherein the connection part 401 is made of a conductive material.

The energy generation layer 300 includes a plurality of piezoelectric nanowires 310 and a photoelectric conversion layer. In one embodiment the photoelectric conversion layer may be an organic material layer 320 that produces electron-hole pairs (excitons) by absorbing light such as sunlight, and may include a p-type semiconductor.

The organic material layer 320 may include a p-type semiconductor having piezoelectric characteristics. Examples of the p-type semiconductor include at least one selected from poly(3-hexylthiophene), polyaniline, polypyrrole, poly(p-phenylene vinylene) ("PPV"), polyvinylene, polyacetylene, polythiophene, combinations thereof and derivatives thereof. In one embodiment the organic material layer 320 may include poly(2,7-carbazole).

Embodiments of the piezoelectric nanowire 310 may include zinc oxide (ZnO), lead zirconate titanate (PZT), barium titanate ($BaTiO_3$), aluminum nitride (AlN), gallium nitride (GaN), or silicon carbide (SiC), and other piezoelectric materials with similar characteristics, or combinations thereof. In the present embodiment, the piezoelectric material making up the piezoelectric nanowire 310 may include semiconductor characteristics. For example, a piezoelectric nanowire 310 made of undoped zinc oxide (ZnO) has n-type semiconductor characteristics.

A plurality of piezoelectric nanowires 310 may be grown on the first electrode 120. In an embodiment where a plurality of piezoelectric nanowires 310 are grown on the first electrode 120 instead of directly grown on the first substrate 110, the growth of the piezoelectric nanowires 310 can be easily controlled so that, for example, the piezoelectric nanowires 310 may be grown in a vertical direction with respect to the first electrode 120, and uniformity of shapes or directions between each piezoelectric nanowire 310 may be improved. In one embodiment, prior to the growth of the nanowire 310, a thin film of conductive zinc oxide (ZnO) may be grown on the first substrate 110, and in such an embodiment, the zinc oxide thin film which remains after forming the nanowire 310 may function as a first electrode 120.

The piezoelectric nanowire 310 may extend vertically with respect to the surface of the first electrode 120 and/or the second electrode 220. Embodiments include configurations wherein the piezoelectric nanowire 310 may extend to be inclined in a non-vertical direction with respect to the surface of the first electrode 120 and the second electrode 220. The number of piezoelectric nanowires 310 shown in this embodiment and drawings are illustrative, and it is clear that the number and disposition of piezoelectric nanowires 310 may be varied depending on a size and use of the apparatus.

Figure 3:
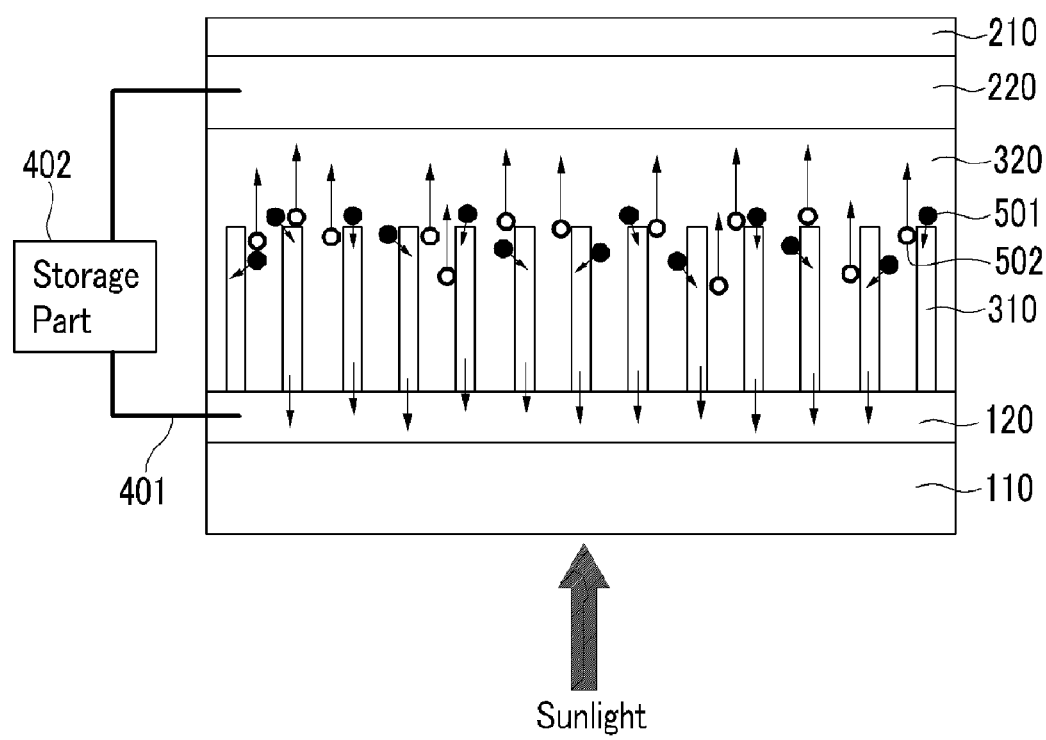
FIG. 3 is a conceptual cross-sectional view showing a first operation of an embodiment of an apparatus for generating electrical energy.
Figure 4:
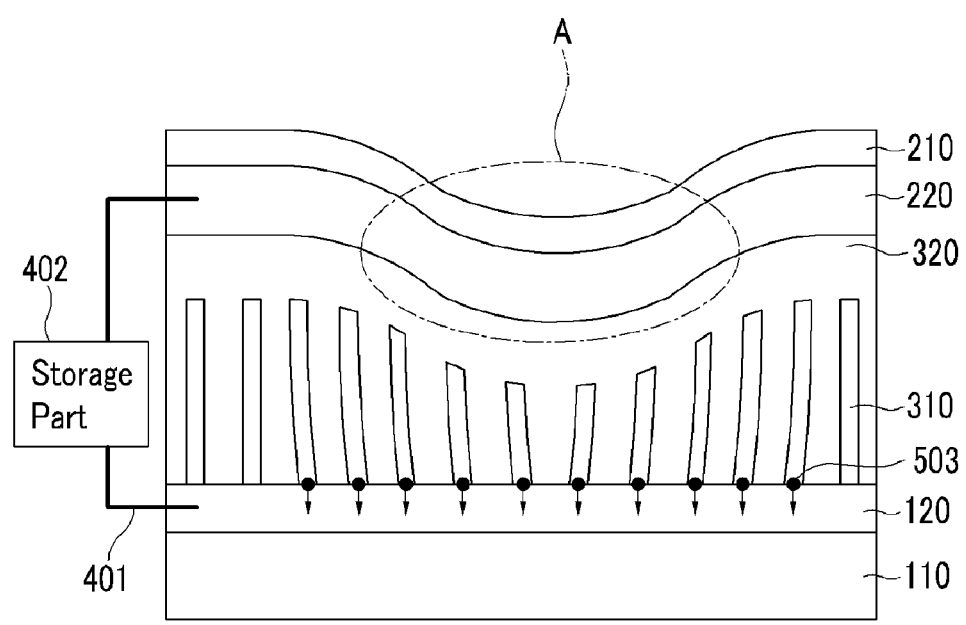
FIG. 4 is a conceptual cross-sectional view showing a second operation of an embodiment of an apparatus for generating electrical energy.

The operation of the apparatus for generating electrical energy according to the embodiment shown in FIG. 1 and FIG. 2 will now be described in detail with reference to FIG. 3 and FIG. 4. FIG. 3 is a conceptual cross-sectional view showing an embodiment of a first operation of the embodiment of an apparatus for generating electrical energy, and FIG. 4 is a conceptual cross-sectional view showing an embodiment of a second operation of the embodiment of an apparatus for generating electrical energy.

First, referring to FIG. 3, a first operation wherein the apparatus for generating electrical energy absorbs light such as sunlight is described in detail.

If light, such as sunlight, is irradiated to the apparatus for generating electrical energy, all of, or only a portion of, the irradiated light may reach the energy generation layer 300. Electrons included in the energy generation layer 300 absorb energy from the irradiated light, and then electron-hole pairs (excitons) of an excited state may be formed. The electron-hole pairs may be separated into electrons 501 and holes 502 at the interface between the p-type organic material layer 320 and the n-type nanowire 310. The separated electrons 501 are transported to an anode, i.e., the first electrode 120, along the n-type nanowire 310, and the holes 502 are transported to a cathode, i.e., the second electrode 220, along the organic material layer 320.

Although sunlight is shown as being irradiated from the bottom of the apparatus for generating electrical energy in the illustrated embodiment, sunlight may also or alternatively be irradiated from the top of the apparatus. In the embodiment where sunlight is irradiated from the top of the apparatus for generating electrical energy, a plurality of piezoelectric nanowires 310 may induce a light-harvesting effect for the irradiated light in order to improve electrical energy generation efficiency of the energy generation layer 300.

As the electrons 501 are transported to the first electrode 120 and the holes 502 are transported to the second electrode 220 as explained above, a current may flow through a closed circuit consisting of the first electrode 120 and the second electrode 220 connected to each other by the connection part 401, and the energy generation layer 300. The storage part 402 may be electrically connected to the connection part 401 so that electrical energy generated by the energy generation layer 300 may be stored therein.

In one embodiment, the storage part 402 may include a chargeable battery, a capacitor, or other electrical energy storage devices. Embodiments of the battery may include a nickel-cadmium battery, a nickel-hydrogen battery, a lithium ion battery, a lithium polymer battery, and other similar batteries. The storage part 402 may further include an amplifier (not shown) for amplifying a voltage.

Next, referring to FIG. 4, a second operation wherein stress is applied to the apparatus for generating electrical energy is described in detail.

If stress is applied to the apparatus for generating electrical energy, the second substrate 210 and the second electrode 220 may bend down at a position where stress is applied A (also referred to as a "stress-applied position" A). As the second substrate 210 and the second electrode 220 bend down, the distance between the first electrode 120 and the second electrode 220 decreases, and thus piezoelectric nanowires 310 disposed at the position A may be compressed and physically transformed, and the transformed piezoelectric nanowires 310 exhibit a piezoelectric effect. Thus, each portion of the piezoelectric nanowires 310 has a predetermined electrical potential due to the applied compressive stress or tensile stress.

Electrons 503 generated by the piezoelectric effect of the piezoelectric nanowires 310 are transported to the first electrode 120, e.g., along the nanowires 310, thus generating electrical energy.

At this time, the electrical energy generated by the piezoelectric nanowires 310 may be stored in the storage part 402.

Although FIG. 4 illustrates a case wherein stress is applied to the top of the apparatus for generating electrical energy to bend the second substrate 210 and the second electrode 220, the same effect may be obtained by applying stress to the first electrode 120 or both of the first electrode 120 and the second electrode 220 simultaneously. Thus, electrical energy may be generated by pressing or bending the apparatus for generating electrical energy.

As explained, the apparatus for generating electrical energy may generate electrical energy by a piezoelectric phenomenon by applying stress to the piezoelectric nanowires 310, as well as using light such as sunlight.

Figure 5:
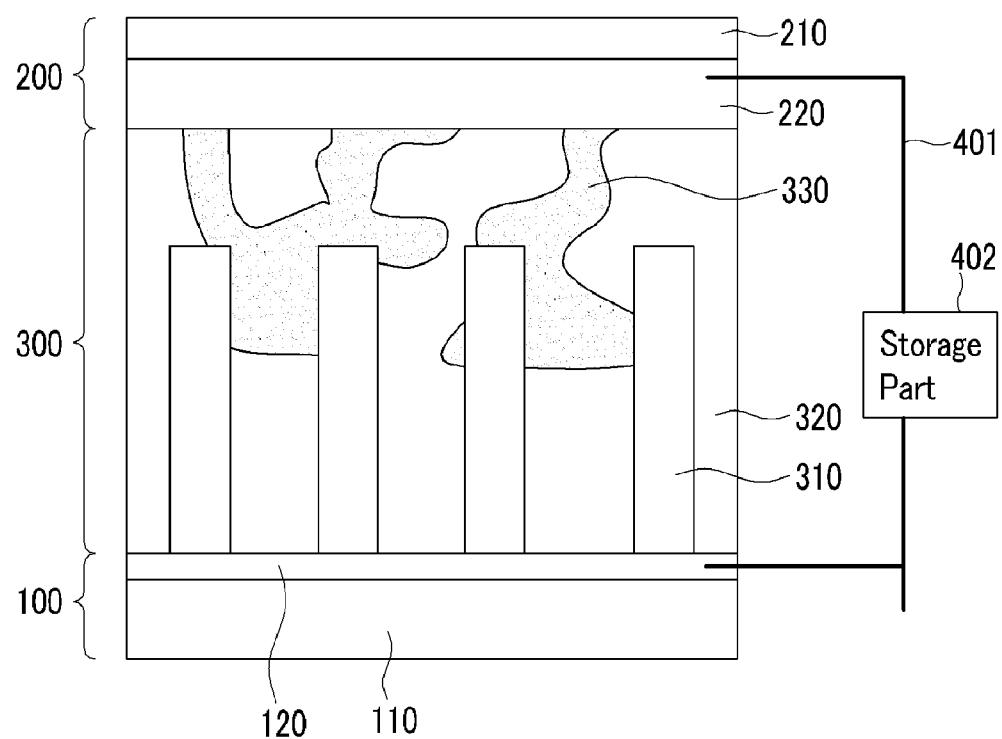
FIG. 5 is a schematic cross-sectional view of an embodiment of an apparatus for generating electrical energy.
Figure 6:
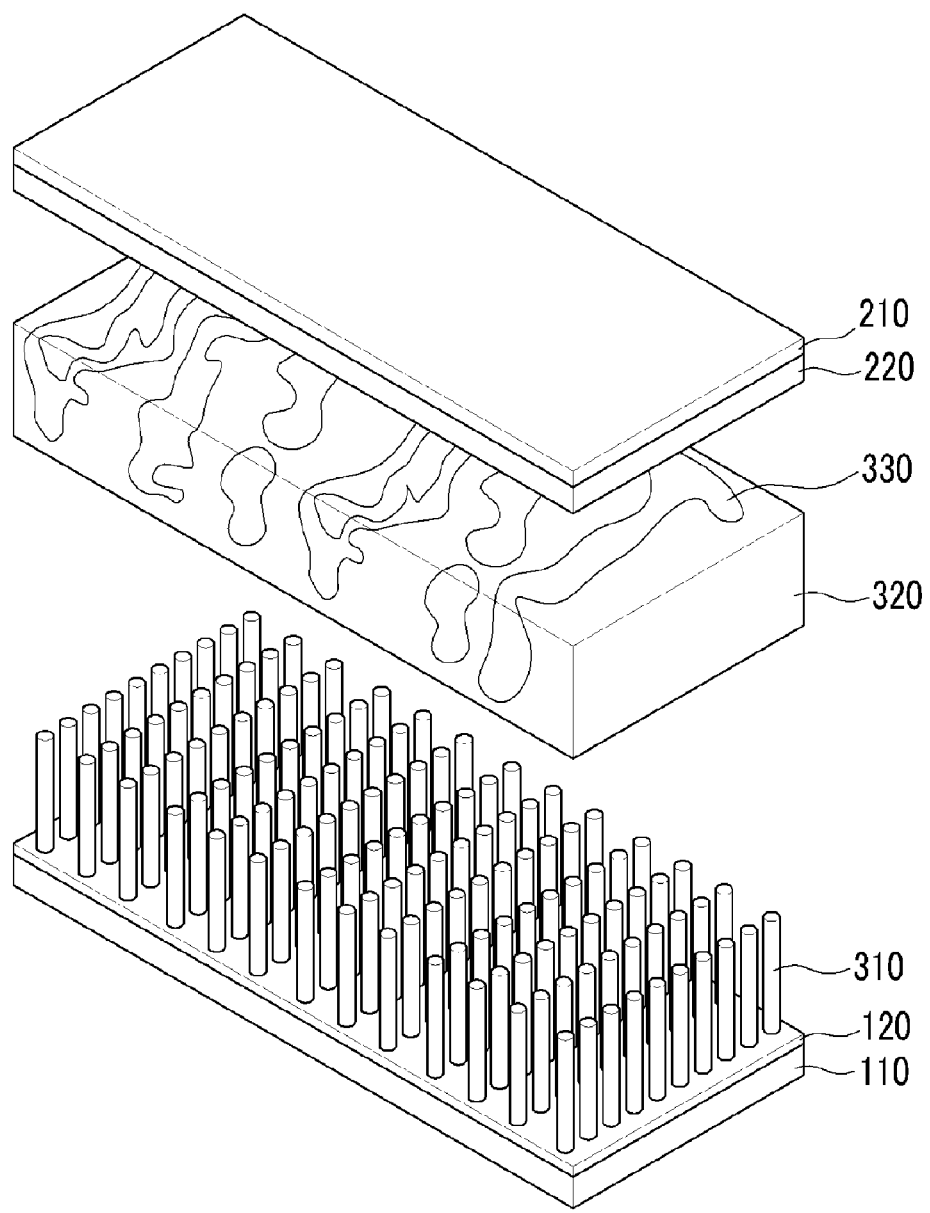
FIG. 6 is an exploded perspective view of the embodiment of an apparatus for generating electrical energy shown in FIG. 5.

Referring to FIG. 5 and FIG. 6, another embodiment of an apparatus for generating electrical energy is described in detail. FIG. 5 is a schematic cross-sectional view of another embodiment of an apparatus for generating electrical energy, and FIG. 6 is an exploded perspective view of the embodiment of an apparatus for generating electrical energy shown in FIG. 5.

Referring to FIG. 5 and FIG. 6, an embodiment of an apparatus for generating electrical energy is similar to the embodiment as shown in FIG. 1 and FIG. 2. Specifically, the apparatus for generating electrical energy includes a lower substrate 100 and an upper substrate 200 disposed substantially opposite to each other, an energy generation layer 300 that is disposed between the lower substrate 100 and the upper substrate 200, a connection part 401 that electrically connects the lower substrate 100 and the upper substrate 200, and a storage part 402 that is connected to the connection part 401. The energy generation layer 300 may be formed on the lower substrate 100.

The lower substrate 100 includes a first substrate 110 and a first electrode 120 that is formed on the first substrate 110, and the upper substrate 200 includes a second substrate 210 and a second electrode 220 that is formed on the second substrate. In one embodiment the first substrate 110 and the second substrate 210 may be flexible and transparent. Although not shown, a blocking layer or a transport layer may be further disposed on the first electrode 120 and the second electrode 220 in order to facilitate transport of electrons and holes in one direction, as described above. The first electrode 120 and the second electrode 220 are connected to each other by a connection part 401. In the present embodiment, the connection part 401 is made of a conductive material.

The energy generation layer 300 includes a plurality of piezoelectric nanowires 310 and a photoelectric conversion layer.

Contrary to the previous embodiment, the photoelectric conversion layer of the present embodiment of an apparatus for generating electrical energy further includes an organic material layer 320 that produces electron-hole pairs (excitons) by absorbing light, such as sunlight, and an inorganic material layer 330 that is distributed in the organic material layer 320.

The organic material layer 320 and the inorganic material layer 330 are mixed between the first electrode 120 and the second electrode 220. In one embodiment, the mixing is not entirely homogeneous, rather the inorganic material layer 330 tends to form lobes of material within the organic material layer 320. In one embodiment, the organic material layer 320 may include a p-type organic semiconductor, and the inorganic material layer 330 may be an n-type semiconductor.

The organic material layer 320 may include a semiconductor having piezoelectric characteristics such as poly(3-hexylthiophene) ("P3HT"), polyaniline, polypyrrole, poly(p-phenylene vinylene) ("PPV"), polyvinylene, polyacetylene, polythiophene, combinations thereof and derivatives thereof. In one embodiment, the organic material layer 320 may include poly(2,7-carbazole).

In one embodiment, the inorganic material layer 330 may include at least one of phenyl-C61-butyric acid methyl ester ("PCBM"), phenyl-C71-butyric acid methyl ester ($PC_{71}BM$), and other materials with similar characteristics.

The piezoelectric nanowire 310 may include zinc oxide (ZnO), lead zirconate titanate (PZT), barium titanate ($BaTiO_3$), aluminum nitride (AlN), gallium nitride (GaN), silicon carbide (SiC), and another piezoelectric material, or combinations thereof.

In one embodiment, a plurality of piezoelectric nanowires 310 may be grown on the first electrode 120.

The piezoelectric nanowires 310 may extend in a vertical direction with respect to a surface of the first electrode 120 and the second electrode 220, e.g., in a direction substantially perpendicular to both the surface of the first electrode 120 and a surface of the second electrode 220. The piezoelectric nanowires 310 may extend to be inclined in a non-vertical direction with respect to the surface of the first electrode 120 and the second electrode 220, e.g., the piezoelectric nanowires 310 may extend to be substantially oblique to the surface of the first electrode 120 and the second electrode 220. The number of piezoelectric nanowires 310 shown in the present embodiment and drawings is illustrative, and it is clear that the number and disposition of the piezoelectric nanowires 310 may be varied depending on the size and use of the apparatus.

Figure 7:
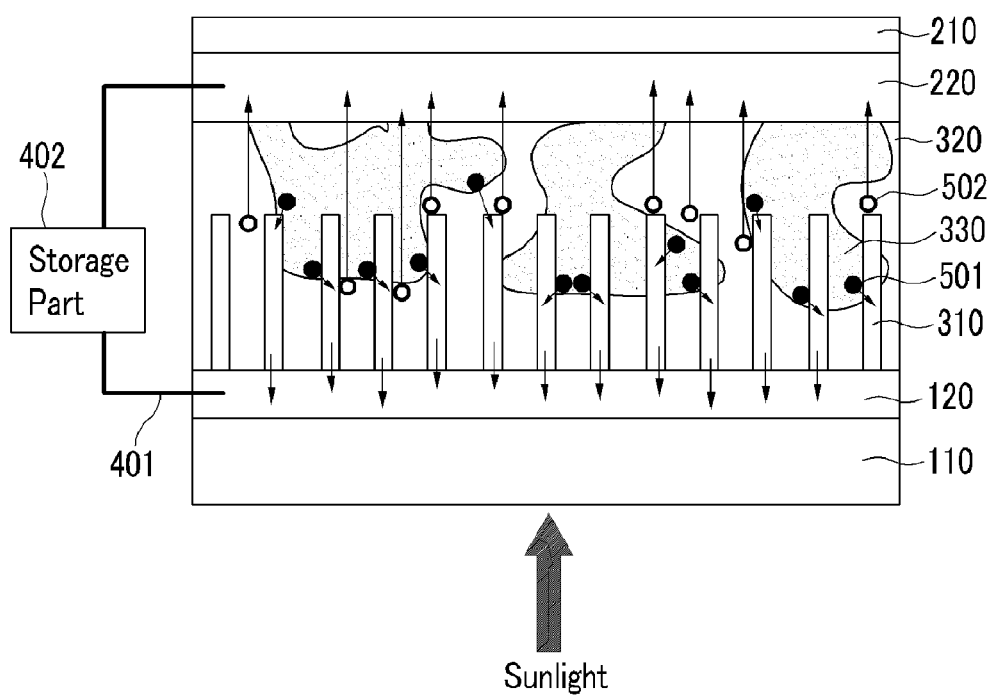
FIG. 7 is a conceptual cross-sectional view showing a first operation of an embodiment of an apparatus for generating electrical energy.
Figure 8:
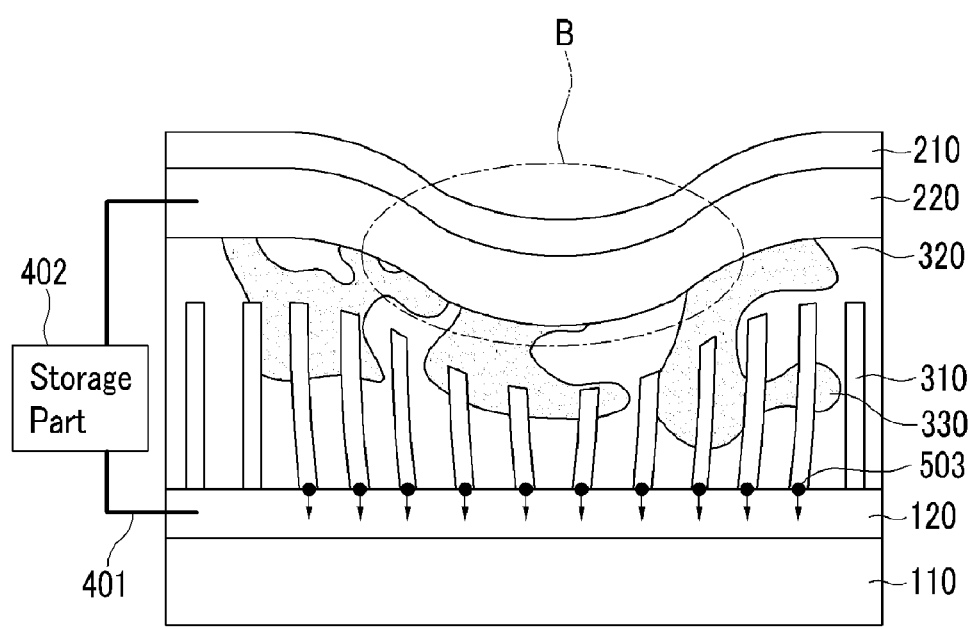
FIG. 8 is a conceptual cross-sectional view showing a second operation of an embodiment of an apparatus for generating electrical energy.

Operation of the apparatus for generating electrical energy will now be described in detail with reference to FIGS. 7 and 8. FIG. 7 is a conceptual cross-sectional view showing an embodiment of a first operation of the embodiment of an apparatus for generating electrical energy, and FIG. 8 is a conceptual cross-sectional view showing an embodiment of a second operation of an embodiment of the apparatus for generating electrical energy.

First, referring to FIG. 7, a first operation wherein the apparatus for generating electrical energy absorbs light, such as sunlight, is described in detail.

If light, such as sunlight, is irradiated to the apparatus for generating electrical energy, and electrons included in the energy generation layer 300 absorb energy from the irradiated light, electron-hole pairs (excitons) of an excited state may be formed. The electron-hole pairs may be separated into electrons 501 and holes 502 at the interface between the p-type organic material layer 320 and the n-type inorganic material layer 330, respectively. The separated electrons 501 are transported to an anode, which in the present embodiment is the first electrode 120, along the n-type inorganic material layer 330, and the holes 502 are transported to a cathode, which in the present embodiment is the second electrode 220, along the organic material layer 320.

The electrons 501 are transported by hopping between the n-type inorganic material layers 330 that are spaced apart from each other, and the separated electrons 501 and holes 502 may be recombined and lost during the hopping between the separated inorganic material layers 330. Since the inorganic material layer 330 of the present embodiment of an apparatus for generating electrical energy contacts a plurality of the piezoelectric nanowires 310, the piezoelectric nanowires 310 connect the inorganic material layers 330 that are spaced apart from each other, and thus electrons 501 may be easily transported to the first electrode 120 through the piezoelectric nanowires 310. Thus, the piezoelectric nanowire 310 may function as a transport layer for the electrons 501.

As explained above, since the photoelectric conversion layer of the energy generation layer of the present embodiment of an apparatus for generating electrical energy further includes an inorganic material layer 330 that is distributed in an organic material layer 320, the efficiency of separating electron-hole pairs produced in the organic material layer 320 may be improved and electron transport may be facilitated.

Thus, as electrons 501 are transported to the first electrode 120 and holes 502 are transported to the second electrode 220, current may flow through a closed circuit consisting of the first electrode 120 and the second electrode 220 that are connected to each other by the connection part 401, and an energy generation layer 300. The storage part 402 may be electrically connected to the connection part 401 so that electrical energy produced by the energy generation layer 300 may be stored in the storage part 402.

Next, referring to FIG. 8, a second operation wherein stress is applied to the embodiment of an apparatus for generating electrical energy is described in detail.

If stress is applied to the present embodiment of an apparatus for generating electrical energy, the second substrate 210 and the second electrode 220 may bend down at a position where stress is applied B (also referred to as "a stress-applied position" B). As the second substrate 210 and the second electrode 220 are bent down, the distance between the first electrode 120 and the second electrode 220 decreases and thus piezoelectric nanowires 310 disposed at the position (B) may be compressed and physically transformed. The transformed piezoelectric nanowires 310 exhibit the piezoelectric effect, and electrons 503 generated by piezoelectric effects on the piezoelectric nanowires 310 are transported to the first electrode 120 thus generating electrical energy. Electrical energy produced by the nanowires 310 may be stored in the storage part 402.

Although FIG. 8 illustrates an embodiment wherein stress is applied to the top of the apparatus for generating electrical energy to bend the second substrate 210 and the second electrode 220, the same effects may be obtained by applying stress to the first electrode 120 and/or both of the first electrode 120 and the second electrode 220. Thus, electrical energy may be generated by pressing or bending the apparatus for generating electrical energy.

As explained above, the apparatus for generating electrical energy may generate electrical energy by the piezoelectric phenomenon by applying stress to the nanowires 310, as well as by using light, such as sunlight.

The photoelectric conversion layer of the energy generation layer 300 of the present embodiment of an apparatus for generating electrical energy further includes the inorganic material layer 330 that is distributed in the organic material layer 320 and electrons produced in the photoelectric conversion layer are transported to an anode through the inorganic material layer 330, and the piezoelectric nanowires 310 may function as a transport layer for electrons 501. Therefore, energy generation efficiency of the photoelectric conversion layer may be improved.

Many features of the embodiments of the apparatus for generating electrical energy as shown in FIG. 1 to FIG. 4 may be applied to the apparatus for generating electrical energy as shown in FIG. 5 to FIG. 8.

Figure 9:
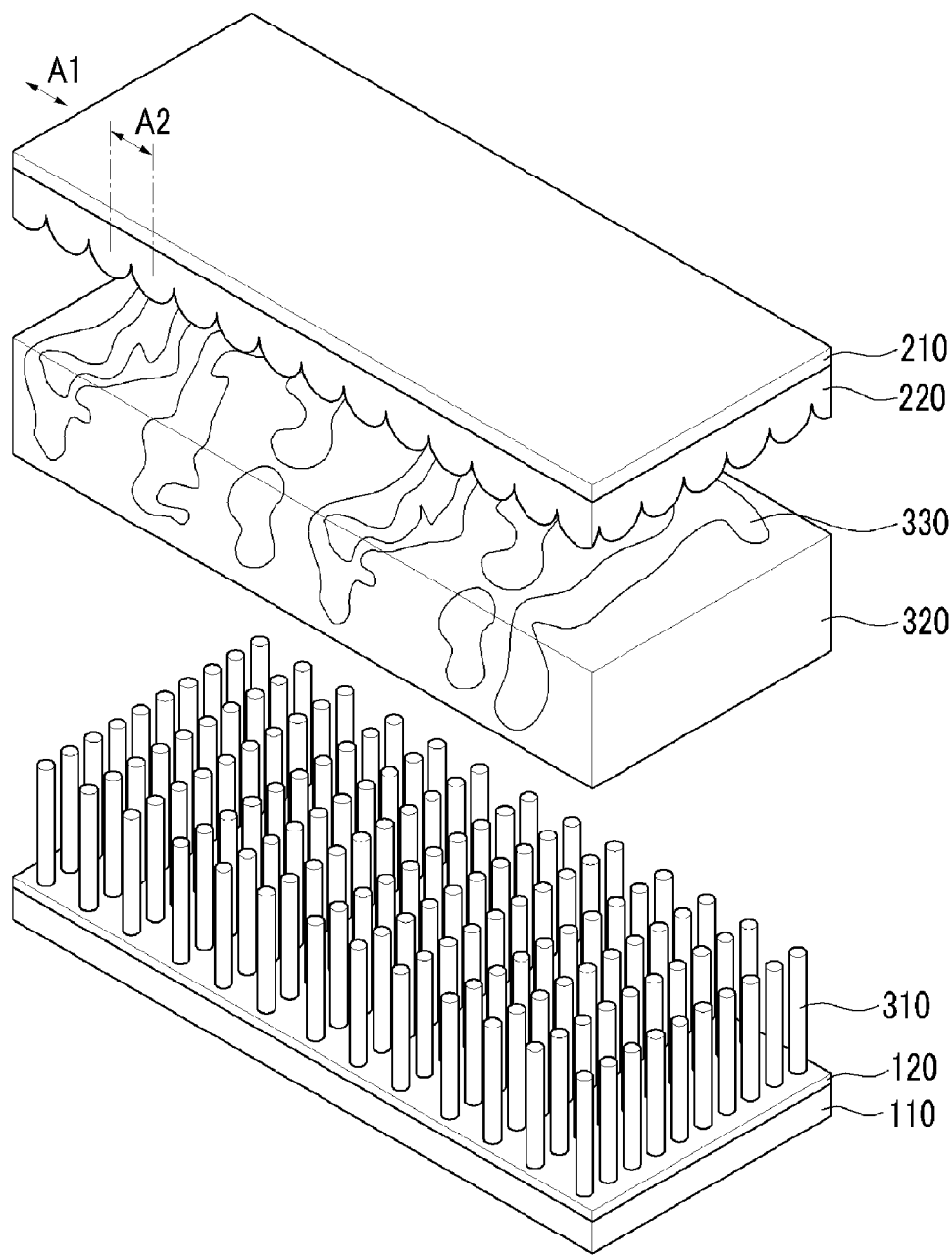
FIG. 9 is an exploded perspective view of another embodiment of an apparatus for generating electrical energy.

Next, referring to FIG. 9, another embodiment of an apparatus for generating electrical energy is described in detail. FIG. 9 is an exploded perspective view of the embodiment of an apparatus for generating electrical energy.

The embodiment of an apparatus for generating electrical energy shown in FIG. 9 is similar to the embodiments of an apparatus shown in FIG. 2 or FIG. 6. The constructions and functions of the first substrate 110, the second substrate 210, and the energy generation layer 300 of the embodiment of an apparatus for generating electrical energy as shown in FIG. 9 are similar to those shown in FIG. 2 or FIG. 6, and therefore detailed descriptions are omitted.

However, contrary to the previously described embodiments of apparatus for generating electrical energy shown in FIG. 2 or FIG. 6, the second electrode 220 of the apparatus for generating electrical energy shown in FIG. 9 has a wave-shaped structure due to a plurality of recess portions (A1) and convex additions (A2), and thus the surface thereof may not be flat, i.e., it is uneven. As such, in the embodiment where the surface of the second electrode 220 is uneven, a contact area between the second electrode 220 and an organic material layer may be increased to improve transport of electrical energy produced by sunlight, thereby improving energy efficiency. That is, the uneven surface of the second electrode 220 increases the surface area thereof.

Many features of the embodiments of apparatus for generating electrical energy shown in FIG. 2 or FIG. 6 may be applied to the embodiment of an apparatus shown in FIG. 9.

Figure 10:
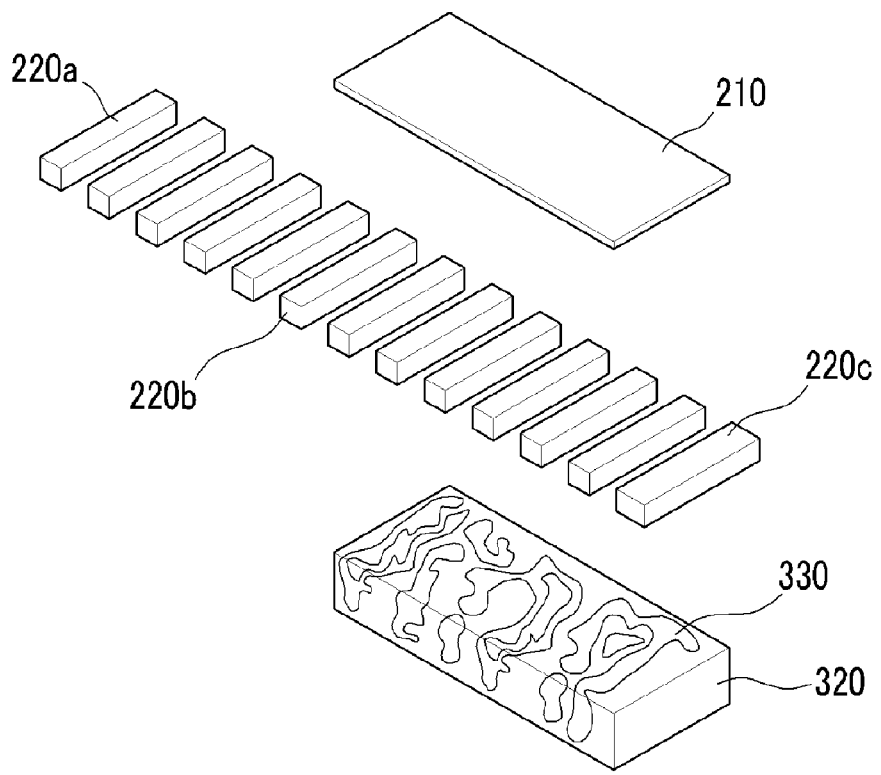
FIG. 10 is an exploded perspective view of another embodiment of an apparatus for generating electrical energy.
Figure 10:
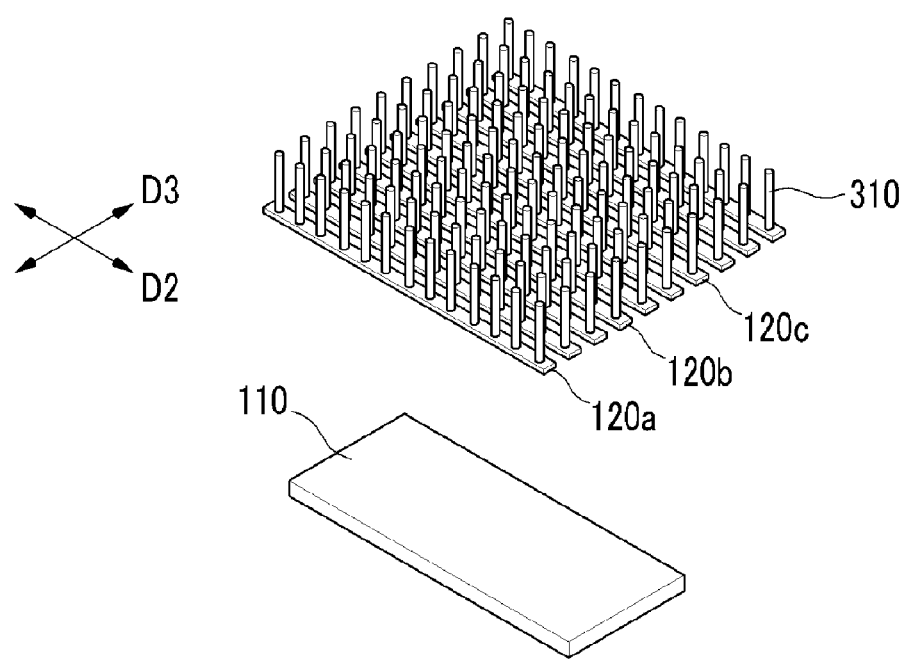

Next, referring to FIG. 10, another embodiment of an apparatus for generating electrical energy is described in detail. FIG. 10 is an exploded perspective view of the additional embodiment of an apparatus for generating electrical energy.

The embodiment of an apparatus for generating electrical energy shown in FIG. 10 is similar to the apparatus for generating electrical energy shown in FIG. 2 or FIG. 6. Particularly, the constructions and functions of the first substrate 110, the second substrate 210, and the energy generation layer 300 of the present embodiment of an apparatus for generating electrical energy shown in FIG. 10 are similar to those shown in FIG. 2 or FIG. 6, and therefore detailed explanations are omitted.

However, contrary to the previously described embodiments of apparatus for generating electrical energy shown in FIG. 2 or FIG. 6, the first electrode 120 and the second electrode 220 of the present embodiment of an apparatus for generating electrical energy shown in FIG. 10 consist of a plurality of sub-electrodes. The first electrode 120 includes a plurality of first sub-electrodes 120a, 120b, and 120c that extend in a first direction (D2) and are spaced apart from each other on the first substrate 110. The second electrode 220 includes a plurality of second sub-electrodes 220a, 220b, and 220c that extend in a second direction (D3) that is substantially perpendicular to the first direction (D2), and are spaced apart from each other on the second substrate 210.

The first electrode 120 and the second electrode 220 respectively including a plurality of first sub-electrodes 120a, 120b, and 120c and second sub-electrodes 220a, 220b, and 220c may have a matrix array format. The number of first electrodes 120 and second electrodes 220 shown in FIG. 10 is illustrative, and it is not limited thereto and may be varied depending upon the size and use of the apparatus.

A stress-applied position, i.e., a position where a stress is applied, may be sensed by sensing an electrode through which current flows among a plurality of the first electrodes 120a, 120b, and 120c and an electrode through which current flows among a plurality of the second electrodes 220a, 220b, and 220c when using an apparatus for generating electrical energy including a first electrode 120 and a second electrode 220 disposed in a matrix array format. Therefore, if the apparatus for generating electrical energy is used as a touch sensor, etc., the position where a stress is applied may be sensed. Further, a multifunctional device that is capable of simultaneously realizing energy generation and pressure sensing may be provided.

Although piezoelectric nanowires 310 are formed on a plurality of the first electrodes 120 in the embodiment of an apparatus for generating electrical energy shown in FIG. 10, piezoelectric nanowires 310 may be formed on the regions where the first electrode 120 and the second electrode 220 cross each other in an another embodiment of an apparatus for generating electrical energy.

Further, although the first electrodes 120 and the second electrodes 220 extend in perpendicular directions with respect to each other in the embodiment of an apparatus for generating electrical energy shown in FIG. 10, the second electrodes 220 may extend in an inclined, e.g., oblique, direction with respect to the first direction (D2) in which the first electrodes 120 extend in an alternative embodiment of an apparatus for generating electrical energy.

In addition, although the surface of the second electrode 220 is flat in the embodiment of an apparatus for generating electrical energy shown in FIG. 10, a recess portion and a convex addition may be formed on the surface of the second electrode 220 such that the surface of the second electrode 220 may be uneven, as in the previously described embodiment of an apparatus for generating electrical energy shown in FIG. 9.

Many features of the embodiment of an apparatus for generating electrical energy shown in FIG. 2 or FIG. 6 may also be applied to the apparatus for generating electrical energy shown in FIG. 10.

As explained, the present embodiment of an apparatus for generating electrical energy may generate electrical energy by absorbing irradiated light or using applied stress. Additionally, since a touch sensor that is capable of sensing the stress-applied position may be realized by forming at least one of the first electrode 120 and the second electrode 220 in an array format in an apparatus for generating electrical energy, the apparatus may be used in an electronic device for sensing stress such as a touch sensor. Further, the apparatus for generating electrical energy may be used for a display device such as a touch panel, a touch screen, or other display devices, as well as other sensing applications, e.g., robot skin, etc. If a plurality of apparatuses for generating electrical energy are electrically connected in an array format, electrical energy produced in each apparatus may be amplified.

Now, referring to FIG. 11A to FIG. 11D, an embodiment of a method for manufacturing an embodiment of an apparatus for generating electrical energy is described in detail. FIGS. 11A to 11D are cross-sectional views of steps of an embodiment of a manufacturing process of an embodiment of an apparatus for generating electrical energy.

Figure 11A:
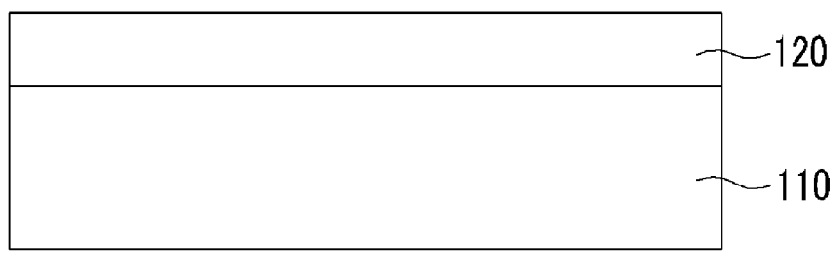
FIGS. 11A to 11D are cross-sectional views of steps of an embodiment of a manufacturing process of an embodiment of an apparatus for generating electrical energy.

Referring to FIG. 11A, a first electrode 120 is formed on a first substrate 110. As described above, the first substrate 110 and the first electrode 120 may be bent by applied stress, and they may be made of a transparent material. The first electrode 120 is made of a conductive material, and embodiments include configurations wherein it may be formed by plating, sputtering, electron beam deposition, thermal deposition, or other similar methods. For example, the first electrode 120 may include indium tin oxide ("ITO"), sapphire, gallium nitride (GaN), silicon carbide (SiC), zinc oxide (ZnO), carbon nanotubes ("CNT"), a conductive polymer, nanofibers, a nanocomposite material, combinations thereof and other materials with similar characteristics. The first electrode 120 may include a gold-palladium alloy (AuPd), gold (Au), palladium (Pd), platinum (Pt), or ruthenium (Ru).

The first electrode 120 may function as a lower electrode for supporting piezoelectric nanowires to be formed thereon as described below.

Figure 11B:
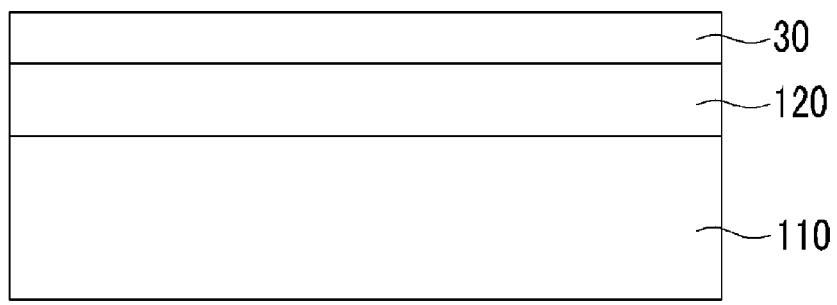

Referring to FIG. 11B, a nanomaterial layer 30 may then be formed on the first electrode 120. In one embodiment, the nanomaterial layer 30 may be thinly formed on the first electrode 120 by spin coating, dip coating, an evaporation method or other similar methods. As an example, in one embodiment the thickness of the nanomaterial layer 30 may be about 3 nm to about 50 nm. According to another embodiment, the nanomaterial layer 30 may be made of zinc acetate.

Figure 11C:
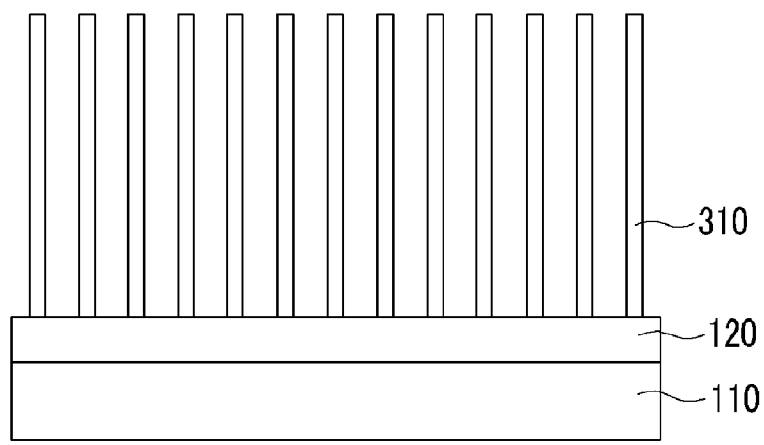

As shown in FIG. 11C, nanowires 310 can be grown by introducing the substrate 110 having the nanomaterial layer 30 formed thereon to a solution in which the nanomaterial is dissolved. The nanowires 310 may have piezoelectric characteristics, and may include zinc oxide (ZnO), lead zirconate titanate (PZT), barium titanate ($BaTiO_3$), aluminum nitride (AlN), gallium nitride (GaN), silicon carbide (SiC), other piezoelectric materials with similar characteristics, or combinations thereof.

Figure 11D:
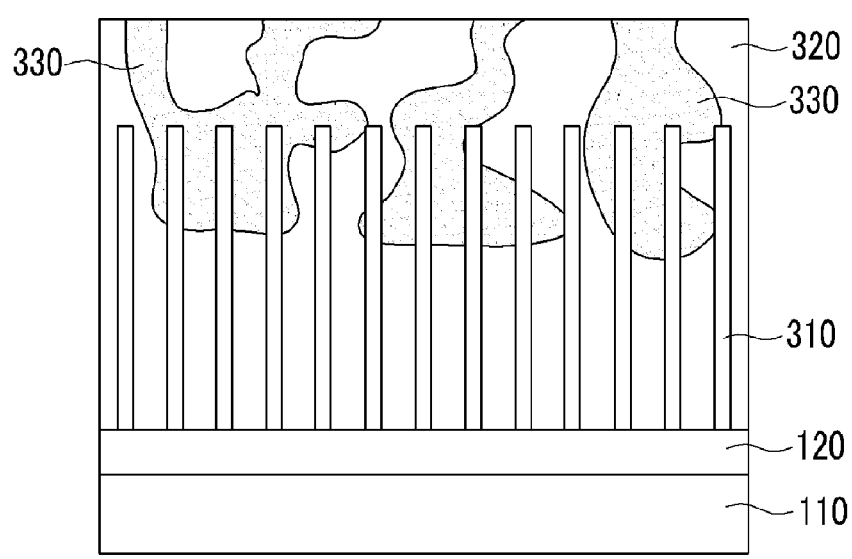

Next, referring to FIG. 11D, a photoelectric conversion layer may be formed on the first electrode 120 having nanowires 310 formed thereon. In the present embodiment, the photoelectric conversion layer may include an organic material layer 320 and an inorganic material layer 330 that is distributed in the organic material layer 320, and the organic material layer 320 may include a p-type organic semiconductor and the inorganic material layer 330 may be an n-type inorganic semiconductor. Alternative embodiments include configurations wherein the photoelectric conversion layer may consist of only the organic material layer 320.

Next, the first electrode 120 and the second electrode 220 are disposed to be substantially opposite to each other with an energy generation layer 300 disposed therebetween. In addition, the first electrode 120 and the second electrode 220 are connected to each other by a connection part 401 to form an apparatus for generating electrical energy. A storage part 402 may be electrically connected to the connection part 401.

Figure 12A:
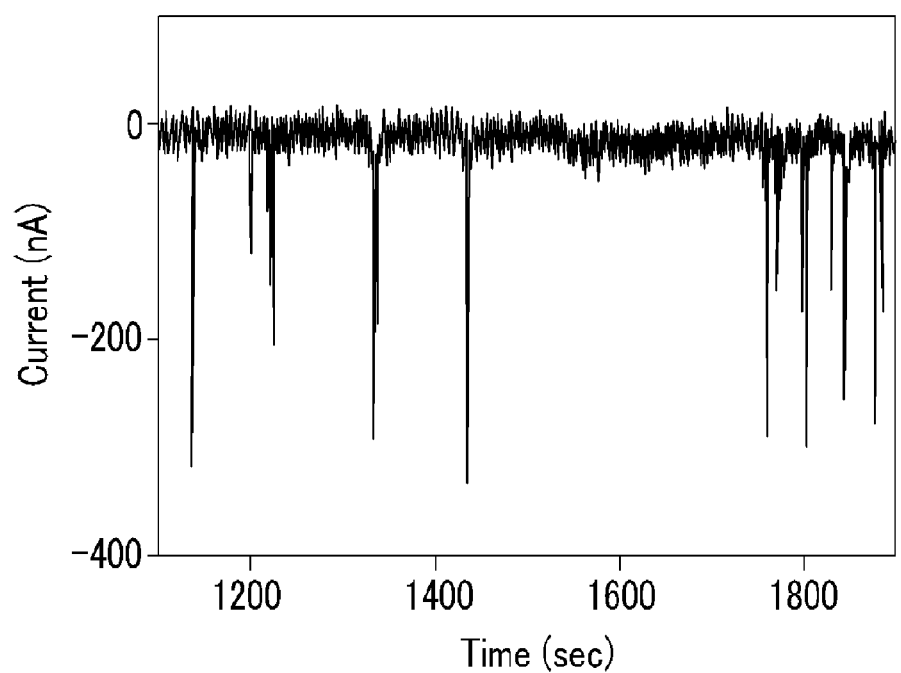
FIGS. 12A to 12C are graphs showing currents of an embodiment of an apparatus for generating electrical energy.
Figure 12B:
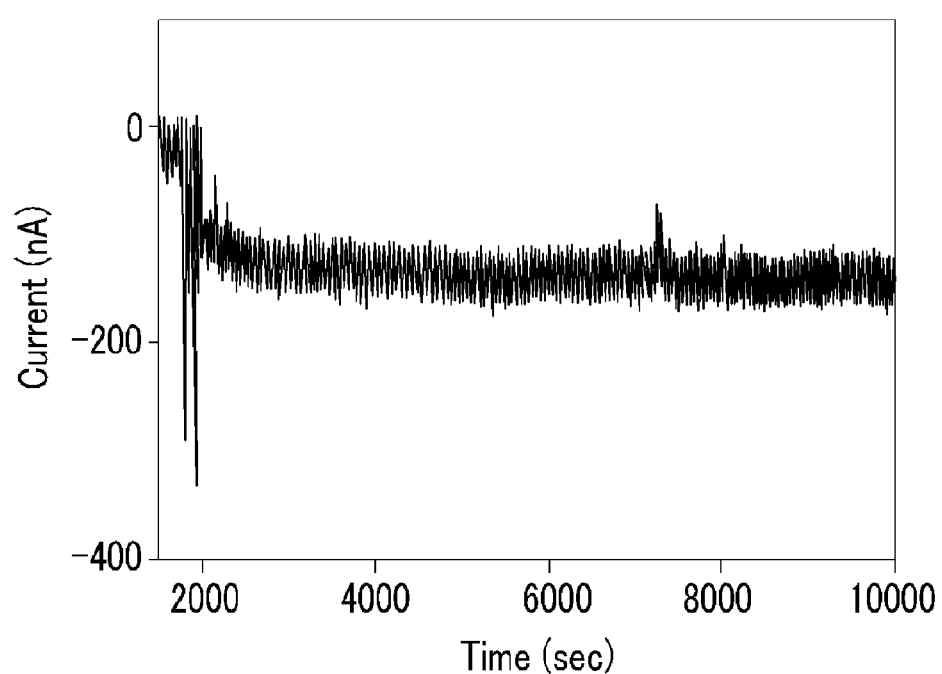
Figure 12C:
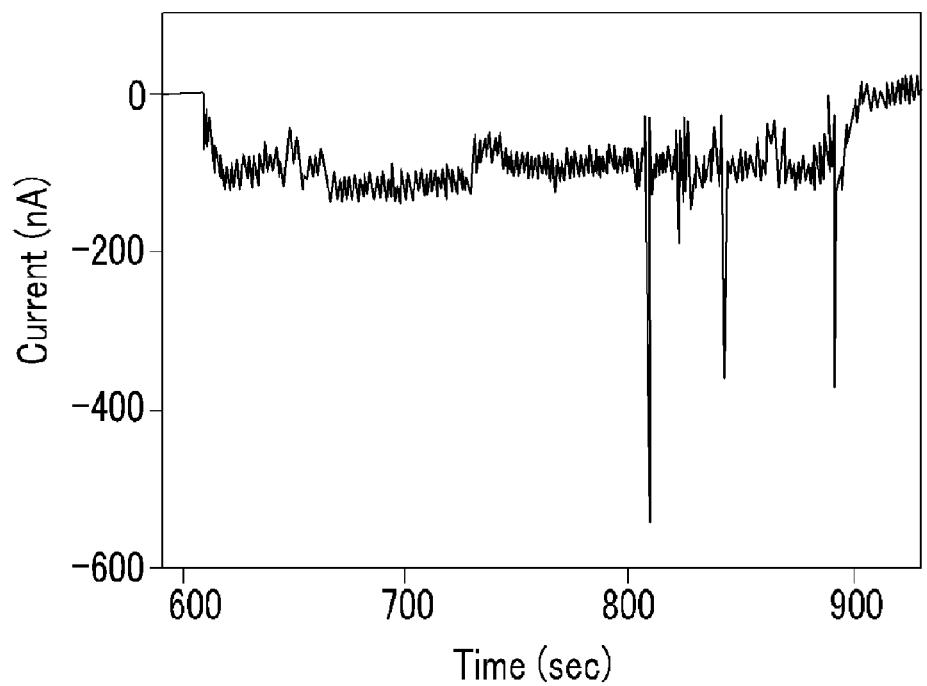

Referring to FIGS. 12A to 12C, an experimental example is hereinafter described. FIGS. 12A to 12C are graphs showing currents of various embodiments of an apparatus for generating electrical energy. In the experimental example, polyethersulfone ("PES") is used as a substrate, and ITO coated on the PES is used as a lower electrode. Zinc oxide (ZnO) piezoelectric nanowires are grown on the ITO lower electrode, and then a P3HT/PCBM organic/inorganic blend was coated thereon. A molybdenum oxide ($MoO_x$) layer is coated on the P3HT/PCBM organic/inorganic blend in order to block electron transport to an upper electrode, and then an Au layer was coated on the upper substrate as an upper electrode to form an apparatus for generating electrical energy.

FIG. 12A is a graph showing peaks of current generated when the apparatus for generating electrical energy used in the experimental example is pressed or bent using an instrument. Referring to FIG. 12A, it can be seen that energy is generated by the piezoelectric effect within the apparatus for generating electrical energy.

FIG. 12B is a graph showing current generated in the apparatus for generating electrical energy used in the experimental example under room lighting conditions. Referring to FIG. 12B, it can be seen that current flows when measured under room lighting conditions, indicating that energy is generated by the solar cell effect in a photoelectric conversion layer.

FIG. 12C is a graph showing current generated when an external force is applied to the apparatus for generating electrical energy used in the experimental example while current is generated in the apparatus under room lighting conditions. That is, while the previous two graphs of FIGS. 12A and 12B illustrated electrical energy production under pressure application conditions and room lighting conditions, respectively, the present graph of 12C illustrates electrical energy production under pressure application conditions and room lighting conditions. Referring to FIG. 12C, it can be seen that in the apparatus for generating electrical energy, energy is generated by the solar cell and additional current is also generated by the piezoelectric effect when external force is applied, so the apparatus can be simultaneously operated by the solar cell effect and the piezoelectric effect.

Figure 13:
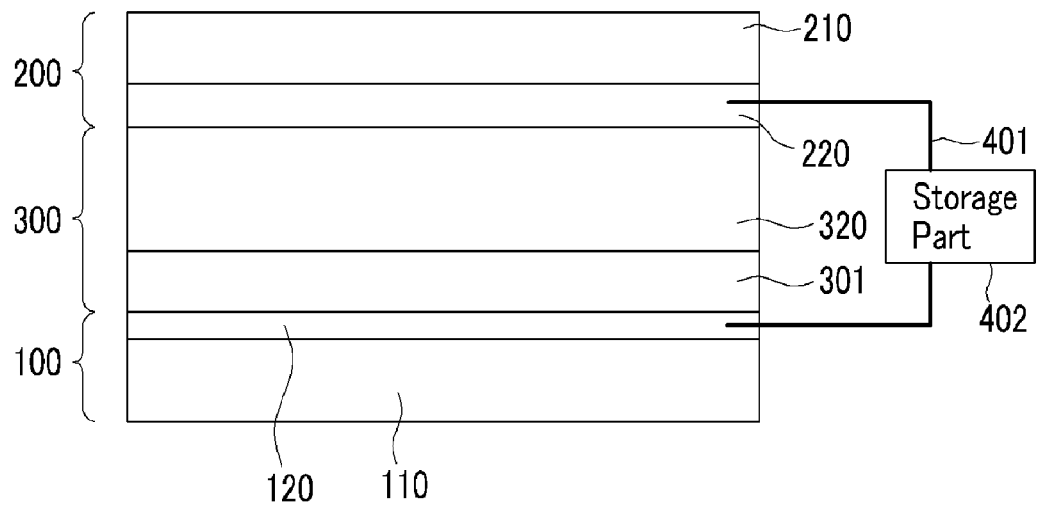
FIG. 13 is a schematic cross-sectional view of an embodiment of an apparatus for generating electrical energy.

Referring to FIG. 13, another embodiment of an apparatus for generating electrical energy is described in detail. FIG. 13 is a schematic cross-sectional view of another embodiment of an apparatus for generating electrical energy.

Referring to FIG. 13, the present embodiment of an apparatus for generating electrical energy is similar to the previously described embodiment of an apparatus for generating electrical energy illustrated in FIGS. 1 and 2. The apparatus for generating electrical energy includes a lower substrate 100 and an upper substrate 200 disposed substantially opposite to each other, an energy generation layer 300 that is disposed between the lower substrate 100 and the upper substrate 200, a connection part 401 that electrically connects the lower substrate 100 and the upper substrate 200, and a storage part 402 that is connected to the connection part 401.

The lower substrate 100 includes a first substrate 110 and a first electrode 120 formed on the first substrate 110, and the upper substrate 200 includes a second substrate 210 and a second electrode 220 formed on the second substrate. In the present embodiment, the first substrate 110 and the second substrate 210 may be flexible and transparent. The first substrate 110 and the second substrate 210 may include a flexible material such as plastic so that it may be transformed by externally applied stresses. The first electrode 120 may include ITO, CNT, a graphene material, a transparent conductive polymer, and other similar materials, or combinations thereof. The second electrode 220 may include gold (Au), an Au-palladium alloy (AuPd), palladium (Pd), platinum (Pt), ruthenium (Ru), and other similar materials, or combinations thereof. At least one of the first electrode 120 and the second electrode 220 may be a flexible electrode that is transformed by stresses applied thereto.

Although not shown in drawings, as described above in order to facilitate transport of electrons and holes in one direction, a blocking layer or a transport layer may be formed on the first electrode 120 or the second electrode 220 or both. For example, by coating a molybdenum oxide (MoOx) layer on the second electrode 220, electron transport may be blocked and hole transport may be improved, thereby selectively transporting holes to the second electrode 220.

The first electrode 120 and the second electrode 220 may be connected to each other by the connection part 401. In the present embodiment, the connection part 401 is made of a conductive material.

The energy generation layer 300 includes the piezoelectric layer 301 and an organic material layer 320.

The piezoelectric layer 301 may include zinc oxide (ZnO), lead zirconate titanate (PZT), barium titanate (BaTiO$_3$), aluminum nitride (AlN), gallium nitride (GaN), or silicon carbide (SiC), and other piezoelectric materials with similar characteristics, or combinations thereof. In the present embodiment, the piezoelectric material making up the piezoelectric layer 301 may include semiconductor characteristics. For example, in one embodiment, a piezoelectric layer 301 made of undoped zinc oxide (ZnO) has n-type semiconductor characteristics.

The present embodiment of an apparatus for generating electrical energy includes a thin planer-shaped piezoelectric layer 301 unlike the nanowire-shaped piezoelectric material that has been described in detail above.

The organic material layer 320 may include a p-type organic semiconductor as a photoelectric conversion layer that produces electron-hole pairs (excitons) by absorbing light, such as sunlight. The organic material layer 320 includes a p-type semiconductor having piezoelectric characteristics. The organic material layer 320 includes at least one material having piezoelectric characteristics selected from poly(3-hexylthiophene), polyaniline, polypyrrole, poly (p-phenylene vinylene) (PPV), polyvinylene, polyacetylene, polythiophene, other materials with similar characteristics and derivatives thereof. In one particular embodiment, the organic material layer 320 may include poly(2,7-carbazole). Although not shown, the energy generation layer 300 may further include an inorganic material layer, and the inorganic material layer may include a n-type semiconductor.

Figure 14:
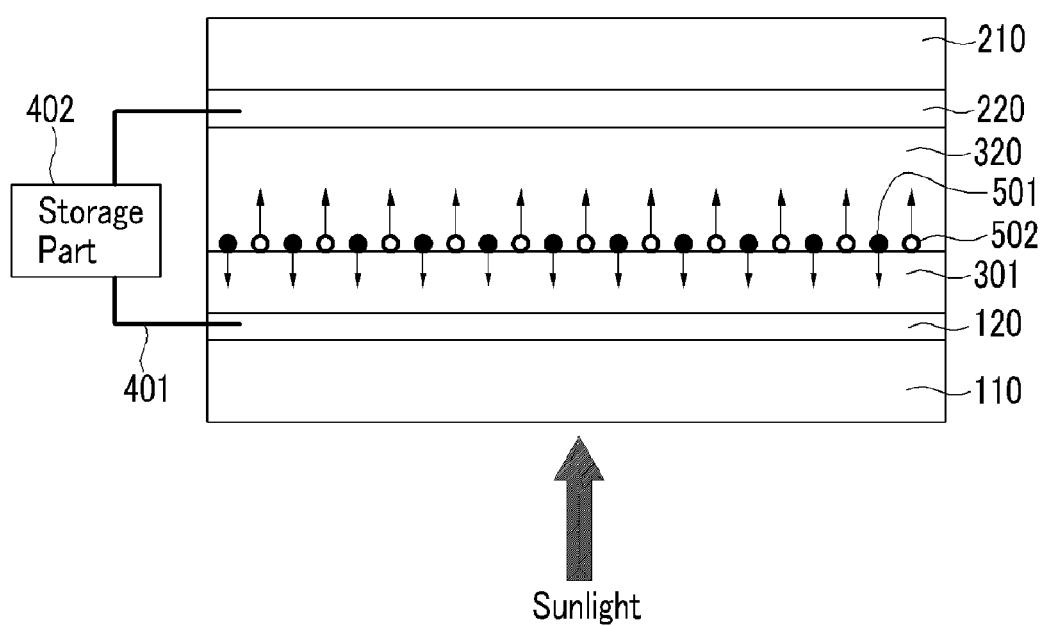
FIG. 14 is a conceptual cross-sectional view showing a first operation of an embodiment of an apparatus for generating electrical energy.
Figure 15:
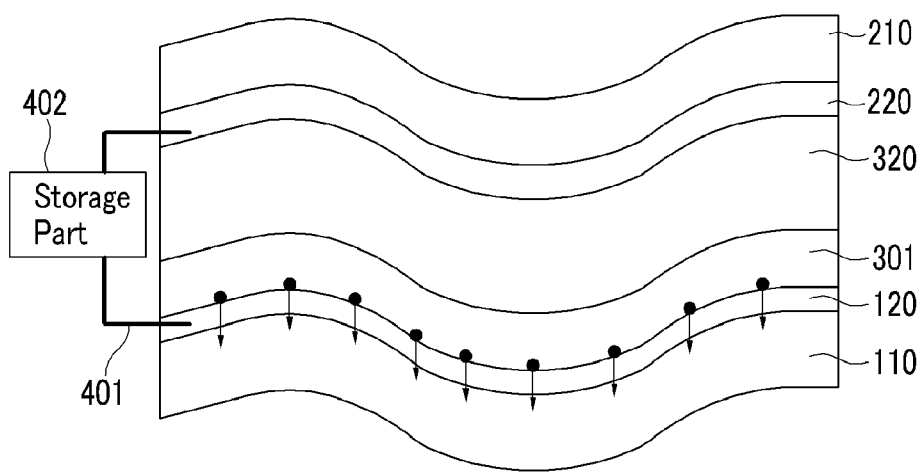
FIG. 15 is a conceptual cross-sectional view showing a second operation of an embodiment of an apparatus for generating electrical energy.

Operation of the present embodiment of an apparatus for generating electrical energy illustrated in FIG. 13 will now be described in detail with reference to FIGS. 14 and 15. FIG. 14 is a conceptual cross-sectional view showing a first operation of the present embodiment of an apparatus for generating electrical energy, and FIG. 15 is a conceptual cross-sectional view showing a second operation of the apparatus for generating electrical energy.

First, referring to FIG. 14, a first operation wherein the apparatus for generating electrical energy absorbs light, such as sunlight, is described in detail.

If light, such as sunlight, is irradiated to the apparatus for generating electrical energy, an entirety or a portion of the irradiated light may reach the energy generation layer 300. Electrons included in the energy generation layer 300 absorb energy from the irradiated light, and then electron-hole pairs (excitons) of an excited state may be formed. The electron-hole pairs may be separated into electrons 501 and holes 502 at the interface between the p-type organic material layer 320 and the n-type nanowire 301. The separated electrons 501 are transported to an anode, which in the present embodiment is the first electrode 120, along the n-type nanowire 301, and the holes 502 are transported to a cathode, which in the present embodiment is the second electrode 220, along the organic material layer 320.

Although sunlight is irradiated from the bottom of the apparatus for generating electrical energy in the embodiment as shown, it may be irradiated from the top of the apparatus.

As the electrons 501 are transported to the first electrode 120 and the holes 502 are transported to the second electrode 220 as explained above, a current may flow through a closed circuit consisting of the first electrode 120 and the second electrode 220 connected to each other by the connection part 401, and the energy generation layer 300. The storage part 402 may be electrically connected to the connection part 401 so that electrical energy generated by the energy generation layer 300 may be stored therein.

The storage part 402 may include a chargeable battery, a capacitor, or another electrical energy storage device as described above, and the battery refers to, as examples, a nickel-cadmium battery, a nickel-hydrogen battery, a lithium ion battery, a lithium polymer battery and various other batteries with similar characteristics, as described above. The storage part 402 may further include an amplifier (not shown) for amplifying voltage.

Next, referring to FIG. 15, a second operation wherein stress is applied to the present embodiment of an apparatus for generating electrical energy is described in detail.

If stress is applied to the present embodiment of an apparatus for generating electrical energy, the apparatus for generating electrical energy may bend in a downward direction. As the second substrate 210 and the second electrode 220 bend down, the piezoelectric layer 301 may be compressed and physically transformed, and the transformed piezoelectric layer 301 exhibits a piezoelectric effect. Thus, each portion of the piezoelectric layer 301 has a predetermined potential due to the applied compressive stress or tensile stress.

Electrons 503 generated by the piezoelectric effect of the piezoelectric layer 301 are transported to the first electrode 120, thus generating electrical energy.

At this time, the electrical energy generated by the piezoelectric layer 301 may be stored in the storage part 402.

Although FIG. 15 illustrates an embodiment wherein stress is applied to both of the first electrode 120 and the second electrode 220, the same effect may be obtained by applying stress to only the top or bottom of the apparatus for generating electrical energy or one side of the apparatus for generating electrical energy. Thus, electrical energy may be generated by pressing or bending the present embodiment of an apparatus for generating electrical energy.

As explained, the present embodiment of an apparatus for generating electrical energy may generate electrical energy by a piezoelectric phenomenon by applying stress to the piezoelectric layer, as well as using light such as sunlight.

Figure 16:
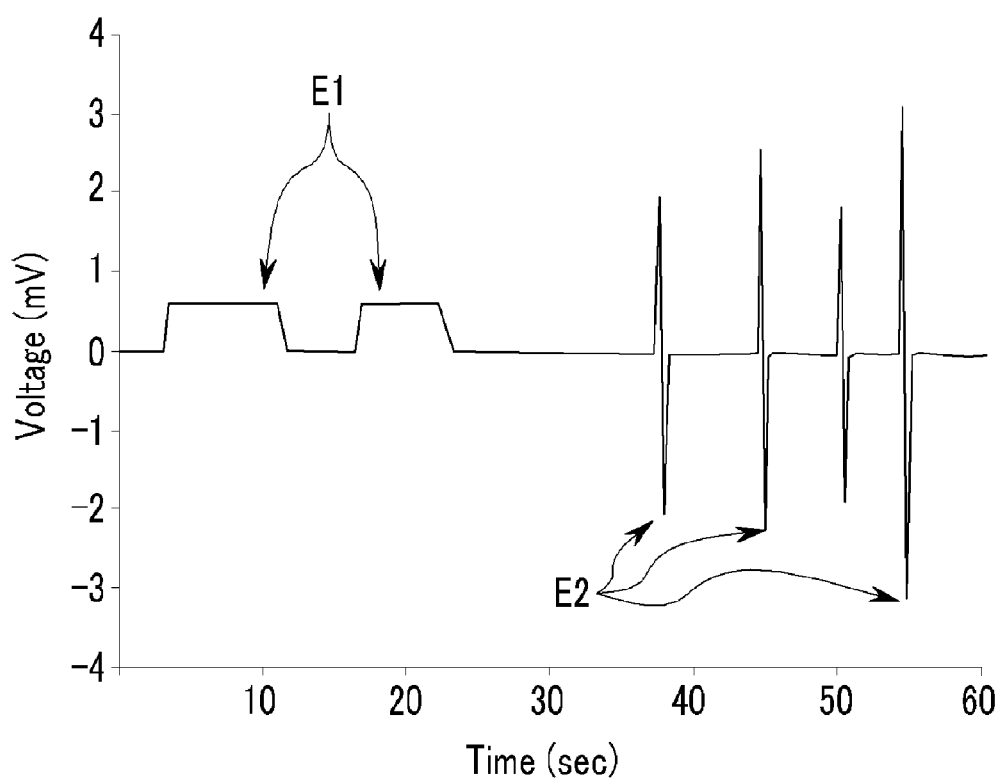
FIG. 16 is a graph showing currents of an embodiment of an apparatus for generating electrical energy.

Referring to FIG. 16, an experimental example is hereinafter described. FIG. 16 is a graph showing current generated in the present embodiment of an apparatus for generating electrical energy. In the experimental example, PES is used as a substrate, and ITO coated on the PES is used as an electrode. A piezoelectric thin layer of zinc oxide (ZnO) is laminated on the ITO electrode, and then a P3HT/PCBM organic/inorganic blend is coated thereon. A molybdenum oxide ($MoO_x$) layer is coated on the P3HT/PCBM organic/inorganic blend in order to block electron transport to an upper electrode, and then a Au layer was coated as an upper electrode to form an apparatus for generating electrical energy.

The present embodiment of an apparatus for generating electrical energy used in the present Experimental Example was placed under room light, and the apparatus for generating electrical energy was pressed or bent. Peaks of the generated voltages are illustrated in FIG. 16.

Referring to FIG. 16, the apparatus for generating electrical energy generates a first voltage (E1) measured under room light, indicating that energy was generated by the solar cell effect in a photoelectric conversion layer. When a stress is applied to the apparatus for generating electrical energy, a second voltage (E2) was generated, indicating that energy was generated by piezoelectric effects of the apparatus for generating electrical energy.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for generating electrical energy comprising a first electrode;
a second electrode spaced apart from the first electrode,
an energy generation layer disposed between the first electrode and the second electrode;
a connection part which electrically connects the first electrode and the second electrode, and
a storage part which is electrically connected to the connection part,
wherein the energy generation layer comprises a photoelectric conversion layer and a plurality of piezoelectric nanowires, and
wherein when an external force is applied to at least one of the first electrode and the second electrode, the plurality of nanowires are transformed to generate electrical energy.

2. The apparatus for generating electrical energy of claim 1, wherein at least one of the first electrode and the second electrode is configured to be transformed by stresses applied thereto.

3. The apparatus for generating electrical energy of claim 2, further comprising:
a first substrate connected to the first electrode; and
a second substrate connected to the second electrode,
wherein at least one of the first substrate and the second substrate is configured to be transformed by stresses applied thereto.

4. The apparatus for generating electrical energy of claim 1, wherein at least one of the first electrode and the second electrode comprises a transparent material.

5. The apparatus for generating electrical energy of claim 4, further comprising:
a first substrate connected to the first electrode; and
a second substrate connected to the second electrode,
wherein at least one of the first substrate and the second substrate comprises a transparent material.

6. The apparatus for generating electrical energy of claim 1, wherein the nanowire includes at least one of zinc oxide, lead zirconate titanate, barium titanate, aluminum nitride, gallium nitride, silicon carbide and combinations thereof.

7. The apparatus for generating electrical energy of claim 1, wherein the photoelectric conversion layer comprises an organic material layer.

8. The apparatus for generating electrical energy of claim 7, wherein the organic material layer includes a p-type semiconductor, and the nanowire has n-type semiconductor characteristics.

9. The apparatus for generating electrical energy of claim 7, wherein the photoelectric conversion layer further comprises an inorganic material layer.

10. The apparatus for generating electrical energy of claim 9, wherein the organic material layer includes a p-type semiconductor, and the inorganic material layer includes an n-type semiconductor.

11. The apparatus for generating electrical energy of claim 9, wherein the organic material layer includes a p-type semiconductor having piezoelectric characteristic.

12. The apparatus for generating electrical energy of claim 11, wherein the organic material layer includes at least one of poly(3-hexylthiophene), polyaniline, polypyrrole, poly(p-phenylene vinylene), polyvinylene, polyacetylene, polythiophene, combinations thereof and derivatives thereof having piezoelectric characteristics.

13. The apparatus for generating electrical energy of claim 1, wherein the surface of the second electrode is uneven.

14. The apparatus for generating electrical energy of claim 1, wherein the first electrode comprises a plurality of first sub-electrodes, and the second electrode comprises a plurality of second sub-electrodes, the plurality of the first sub-electrodes are spaced apart from each other and extend toward a first direction, and the plurality of the second sub-electrodes are spaced apart from each other and extend substantially perpendicularly to the first direction.

15. The apparatus for generating electrical energy of claim 1, wherein the first electrode and the nanowire comprise a same type of material.

16. An apparatus for generating electrical energy comprising:

a first electrode;

a second electrode spaced apart from the first electrode, an energy generation layer which is disposed between the first electrode and the second electrode;

a connection part which electrically connects the first electrode and the second electrode, and a storage part which is electrically connected to the connection part, wherein the energy generation layer comprises a photoelectric conversion layer and a piezoelectric layer, and wherein when an external force is applied to at least one of the first electrode and the second electrode, the piezoelectric layer is transformed to generate electrical energy.

17. The apparatus for generating electrical energy of claim 16, wherein at least one of the first electrode and the second electrode is configured to be transformed by stresses applied thereto.

18. The apparatus for generating electrical energy of claim 17, further comprising a first substrate connected to the first electrode and a second substrate connected to the second electrode, wherein at least one of the first substrate and the second substrate is configured to be transformed by stresses applied thereto.

19. The apparatus for generating electrical energy of claim 16, wherein at least one of the first electrode and the second electrode comprises a transparent material.

20. The apparatus for generating electrical energy of claim 19, further comprising:

a first substrate connected to the first electrode; and a second substrate connected to the second electrode, wherein at least one of the first substrate and the second substrate comprises a transparent material.

21. The apparatus for generating electrical energy of claim 16, wherein the piezoelectric layer is a thin film and comprises at least one of zinc oxide, lead zirconate titanate, barium titanate, aluminum nitride, gallium nitride, silicon carbide (SiC) and combinations thereof.

22. The apparatus for generating electrical energy of claim 16, wherein the photoelectric conversion layer comprises an organic material layer.

23. The apparatus for generating electrical energy of claim 22, wherein the organic material layer comprises a p-type semiconductor, and the piezoelectric layer comprises a material with n-type semiconductor characteristics.

24. The apparatus for generating electrical energy of claim 23, wherein the photoelectric conversion layer further comprises an inorganic material layer.

25. The apparatus for generating electrical energy of claim 24, wherein the organic material layer comprises a p-type semiconductor, and the inorganic material layer comprises an n-type semiconductor.

26. The apparatus for generating electrical energy of claim 22, wherein the organic material layer comprises a p-type semiconductor having piezoelectric characteristics.

27. The apparatus for generating electrical energy of claim 26, wherein the organic material layer comprises at least one material having piezoelectric characteristics selected from the group consisting of poly(3-hexylthiophene), polyaniline, polypyrrole, poly(p-phenylene vinylene) (PPV), polyvinylene, polyacetylene, polythiophene, combinations thereof and derivatives thereof.

28. An apparatus for generating electrical energy comprising a first electrode;

a second electrode spaced apart from the first electrode, and an energy generation layer disposed between the first electrode and the second electrode, wherein the energy generation layer comprises a photoelectric conversion layer and a plurality of piezoelectric nanowires, wherein when an external force is applied to at least one of the first electrode and the second electrode, the plurality of nanowires are transformed to generate electrical energy, and wherein the photoelectric conversion layer comprises an organic material layer which includes a p-type semiconductor, and the nanowire has n-type semiconductor characteristics.

29. The apparatus for generating electrical energy of claim 28, wherein at least one of the first electrode and the second electrode is configured to be transformed by stresses applied thereto.

30. The apparatus for generating electrical energy of claim 29, further comprising:

a first substrate connected to the first electrode; and a second substrate connected to the second electrode, wherein at least one of the first substrate and the second substrate is configured to be transformed by stresses applied thereto.

31. The apparatus for generating electrical energy of claim 28, wherein at least one of the first electrode and the second electrode comprises a transparent material.

32. The apparatus for generating electrical energy of claim 31, further comprising:

a first substrate connected to the first electrode; and a second substrate connected to the second electrode, wherein at least one of the first substrate and the second substrate comprises a transparent material.

33. The apparatus for generating electrical energy of claim 31, wherein the nanowire includes at least one of zinc oxide, lead zirconate titanate, barium titanate, aluminum nitride, gallium nitride, silicon carbide and combinations thereof.

34. The apparatus for generating electrical energy of claim 28, wherein the photoelectric conversion layer further comprises an inorganic material layer.

35. The apparatus for generating electrical energy of claim 34, wherein the organic material layer includes a p-type semiconductor, and the inorganic material layer includes an n-type semiconductor.

36. The apparatus for generating electrical energy of claim 34, wherein the organic material layer includes a p-type semiconductor having piezoelectric characteristic.

37. The apparatus for generating electrical energy of claim 36, wherein the organic material layer includes at least one of poly(3-hexylthiophene), polyaniline, polypyrrole, poly(p-phenylene vinylene), polyvinylene, polyacetylene, polythiophene, combinations thereof and derivatives thereof having piezoelectric characteristics.

38. The apparatus for generating electrical energy of claim 28, wherein the surface of the second electrode is uneven.

39. The apparatus for generating electrical energy of claim 28, wherein the first electrode comprises a plurality of first sub-electrodes, and the second electrode comprises a plurality of second sub-electrodes, the plurality of the first sub-electrodes are spaced apart from each other and extend toward a first direction, and the plurality of the second sub-electrodes are spaced apart from each other and extend substantially perpendicularly to the first direction.

40. The apparatus for generating electrical energy of claim 28, wherein the first electrode and the nanowire comprise a same type of material.

41. An apparatus for generating electrical energy comprising:

a first electrode;

a second electrode spaced apart from the first electrode, and an energy generation layer which is disposed between the first electrode and the second electrode, wherein the energy generation layer comprises a photoelectric conversion layer and a piezoelectric layer, wherein when an external force is applied to at least one of the first electrode and the second electrode, the piezoelectric layer is transformed to generate electrical energy, and wherein the photoelectric conversion layer comprises an organic material layer which includes a p-type semiconductor, and the nanowire has n-type semiconductor characteristics.

42. The apparatus for generating electrical energy of claim 41, wherein at least one of the first electrode and the second electrode is configured to be transformed by stresses applied thereto.

43. The apparatus for generating electrical energy of claim 42, further comprising a first substrate connected to the first electrode and a second substrate connected to the second electrode, wherein at least one of the first substrate and the second substrate is configured to be transformed by stresses applied thereto.

44. The apparatus for generating electrical energy of claim 41, wherein at least one of the first electrode and the second electrode comprises a transparent material.

45. The apparatus for generating electrical energy of claim 44, further comprising:

a first substrate connected to the first electrode; and a second substrate connected to the second electrode, wherein at least one of the first substrate and the second substrate comprises a transparent material.

46. The apparatus for generating electrical energy of claim 41, wherein the piezoelectric layer is a thin film and comprises at least one of zinc oxide, lead zirconate titanate, barium titanate, aluminum nitride, gallium nitride, silicon carbide (SiC) and combinations thereof.

47. The apparatus for generating electrical energy of claim 41, wherein the photoelectric conversion layer comprises an organic material layer.

48. The apparatus for generating electrical energy of claim 47, wherein the organic material layer comprises a p-type semiconductor, and the piezoelectric layer comprises a material with n-type semiconductor characteristics.

49. The apparatus for generating electrical energy of claim 48, wherein the photoelectric conversion layer further comprises an inorganic material layer.

50. The apparatus for generating electrical energy of claim 49, wherein the organic material layer comprises a p-type semiconductor, and the inorganic material layer comprises an n-type semiconductor.

51. The apparatus for generating electrical energy of claim 47, wherein the organic material layer comprises a p-type semiconductor having piezoelectric characteristics.

52. The apparatus for generating electrical energy of claim 51, wherein the organic material layer comprises at least one material having piezoelectric characteristics selected from the group consisting of poly(3-hexylthiophene), polyaniline, polypyrrole, poly(p-phenylene vinylene) (PPV), polyvinylene, polyacetylene, polythiophene, combinations thereof and derivatives thereof.

* * * * *